Figure 1:
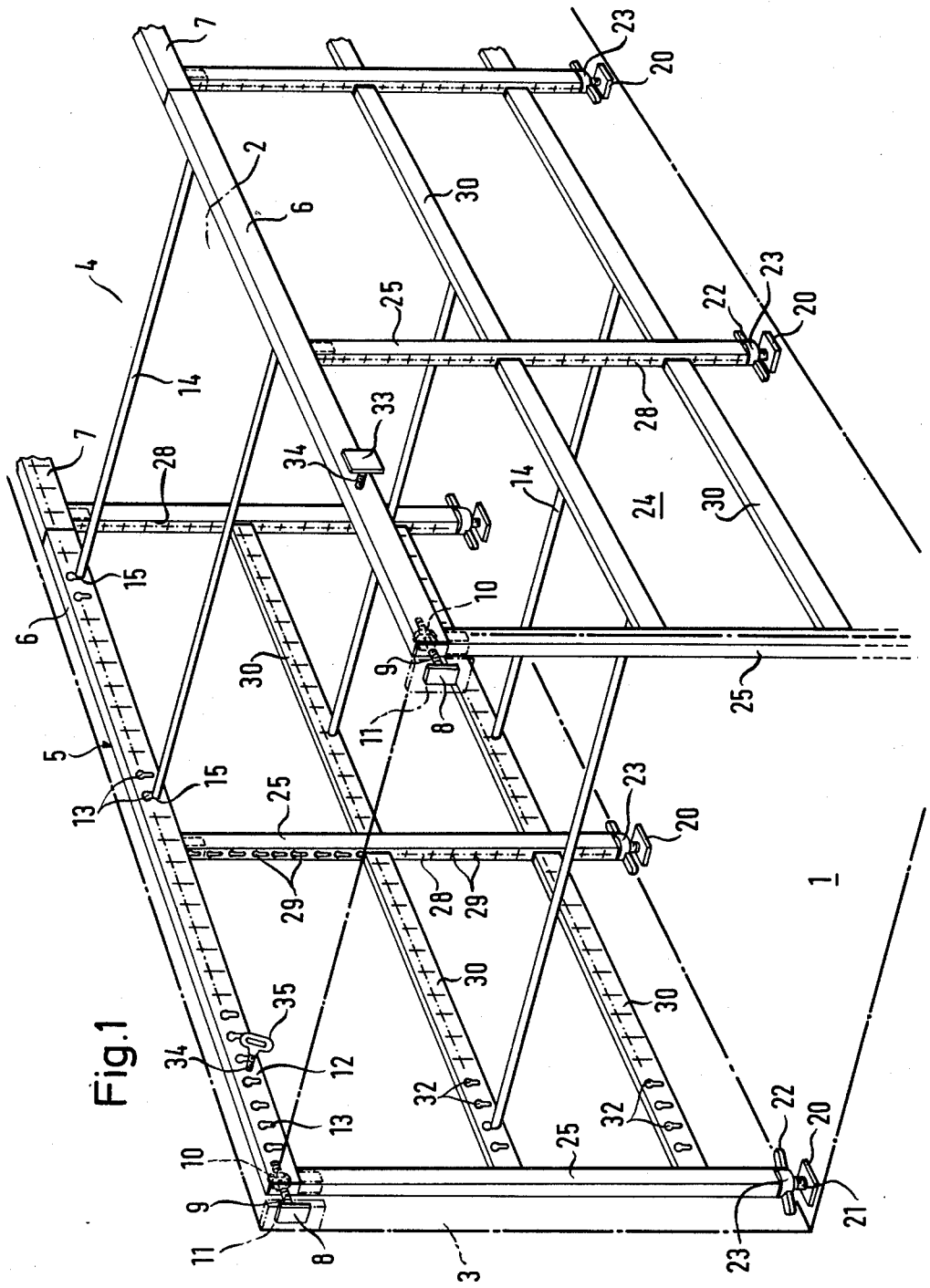

United States Patent [19]

Rennemann

[11] 3,963,290
[45] June 15, 1976

[54] HANGING FITTING FOR FREIGHT RECEPTACLES, KNOWN AS CONTAINERS

[75] Inventor: Albert Rennemann, Goldbach, Germany

[73] Assignee: Johann Birkart, Internationale Spedition, Aschaffenburg, Germany

[22] Filed: Mar. 20, 1975

[21] Appl. No.: 560,317

[52] U.S. Cl. .............................. 312/321; 312/351; 211/191
[51] Int. Cl.² .................... B65D 7/46; A47F 5/10
[58] Field of Search ............ 312/257 SK, 321, 351, 312/352; 220/1.5; 211/175, 176

[56] References Cited
UNITED STATES PATENTS

| | | | |
|---|---|---|---|
| 2,417,387 | 3/1947 | Totty | 312/321 |
| 2,639,042 | 5/1953 | Lambert et al. | 211/175 |
| 3,647,080 | 3/1972 | Denny | 211/176 |
| 3,801,177 | 4/1974 | Fylling et al. | 312/351 |
| 3,861,554 | 1/1975 | Legg | 220/1.5 |

*Primary Examiner*—Casmir A. Nunberg
*Attorney, Agent, or Firm*—Toren, McGeady and Stanger

[57] ABSTRACT

A self-supporting assembly formed as a detachable replacement unit for hanging objects to be shipped, particularly garments, is designed as a frame assembly with a plurality of parts such as perforated rails, suspension rods and side members, many of which may be assembled from identical parts with the support frame being braced within a shipping container by means of spindle drives in such a manner that no fastening with the container itself is necessary thereby avoiding the necessity for structurally altering or damaging the walls of the container or leaving any visible signs of damage in any part of the container.

12 Claims, 8 Drawing Figures

HANGING FITTING FOR FREIGHT RECEPTACLES, KNOWN AS CONTAINERS

This invention relates to a hanging fitting or construction for the freighting of goods which are to be transported suspended in freighting receptacles of large volume and of varying dimensions and shapes, known as containers, and also in the boots or trunks of automobiles.

In modern transportation, containers are used to an increasing extent for the freighting of goods of all types, both pressure-sensitive goods which must be transported suspended and also piece goods; in such containers, the goods can be transported without an intermediate wrapping along a succession of transportation means, such as road vehicles, railways and ships or aircraft followed again by road vehicles or railways from the place of despatch to the destination.

Containers are usually understood to mean receptacles of large size and standardised dimensions, which are equipped with means for acceptance by various transport means such as road vehicles, railway vehicles, ship or aircraft, and which can be lent, hired or leased usually for one direction of transportation, e.g., the outward journey, the container being provided by the transport undertakings, such as the shipping line or airline. This loan or hiring of the containers for continously varying transporting functions assumes that the containers, of standardised dimensions, shall possess smooth wall and floor surfaces and shall thereby be capable of being used for the successive transporting of the differing goods. For the transportation of pressure-sensitive goods such as outer garments, meat or bananas, these containers must therefore be equipped with devices which make possible suspended transportation of these goods and which moreover can be rapidly installed and dismantled without visibly damaging the container walls.

The problem underlying this invention therefore is to create a hanging fitting or construction for large-volume freight receptacles, known as containers, or for the boot or trunk spaces of automobiles, which can be built in without visible damage or modification to the walls, into containers or boot (trunk) spaces and which, with the minimum possible cost of manufacture and installation, consists of simple, standardised components and also can be installed in containers, freight receptacles or boot (trunk) spaces of varying dimensions and shapes, whereby the number of the individual parts of the hanging fitting must be small and thus the return transportation of same must be economical.

This problem is solved according to this invention basically by a hanging construction which comprises a supporting frame constituted of two parallel, longitudinal members fixed in a locking manner at the ends by releasable bracing devices to opposite end walls of the container and of transverse members oriented transversely to these, the frame being supported by vertical props from the container floor and which comprises a number of mountings attached to these frames for hanging bars to be oriented transversely to the longitudinal direction of the frames. The construction preferably consists in total, together with supporting frames and vertical props and also hanging bars, of a large number of mutually identical individual components of short length grouped together, and all the individual components of the construction can be connected together by fitting, locating, plug-in connections. In a first form of embodiment provision is made that the longitudinal members and the vertical props are formed of lengths of a four-sided tube equipped on at least one side with a continuous succession of keyhole-shaped holes, while the transverse members of the supporting frame are constituted of a number of holding bars which can be fitted and located at both ends in the keyhole-shaped recesses in the longitudinal members, whereby the longitudinal members may be assembled from part components, each of a length corresponding to a portion of the maximum standardised container length and joined together by pegs and keyhole-shaped recesses disposed at their ends, which part components possess perpendicularly oriented pegs engaging into the hollow section of the vertical props. For securing this hanging construction in containers, the sections making up the longitudinal members of the supporting frame can be braced by additional, transversely oriented bracing devices from the container side walls, while in order to adjust the vertical props to the varying internal heights of the container, these props are equipped at their lower ends with screw spindle drives, by means of which the props can be braced against the container floor. For mounting rows of hanging bars one above another, longitudinal beam lengths, oriented longitudinally of the container, can be inserted at any desired height between the vertical props, whereby the vertical props possess, on their side faces oriented perpendicularly to the container side walls, rows of keyhole-shaped recesses facing one another, and the longitudinal beam sections can be located at any height in these keyhole-shaped recesses of the vertically oriented props by means of pegs disposed at their ends. The part components constituting the longitudinal members of the supporting frame, and also the longitudinal beam components which can be inserted between the vertical props, may favourably be formed of a channel-section or rectangular tube-section and possess, on their flat side facing towards the centre of the container, rows of successive keyhole-shaped recesses. The pegs or ends of the hanging bars which can be located in the keyhole-shaped recesses in the longitudinal member portions, in the longitudinal beam components, and in the vertical props, may favourably be formed of lengths of round bar equipped with radially-opposed, slit-shaped cuts, so that they may be introduced through the upper circular portion into the keyhole-shaped recesses and located in closely fitting manner in the rectangular lower portion. The hanging bars are favourably constituted of lengths of a thick-walled tube material and are furnished, in the region of their two ends, with radially oriented, slit-shaped cuts, by means of which they can be located in the above-described manner in the keyhole-shaped recesses of the longitudinal member sections or longitudinal beams.

According to a further feature of this invention, there is associated with each hanging bar a coat-hanger retaining device, which comprises two suspension eyes fitted at the ends and a stretchable, especially textile-wrapped cord, equipped at both ends with hooks. To secure the coat-hangers, the hanging bars are loaded by sections alternately from the one and the other side with coat-hangers, and the stretchable cord is passed through between the coat-hanger groups in a meandering fashion and stressed in such a way that it is passed, in its stressed retaining position, alternately before and behind the coat-hangers of the different groups. In this connection it is sufficient, if only individual coat-hangers at certain intervals, are placed upon the hanging bars from the opposite side and the stretchable cord is conducted around these coat-hangers. The suspension eyes for the stretchable cord, which preferably is formed of a rubber clamping band, are preferably so disposed upon the hanging bar that when these bars are located in position, these eyes point downwards.

In another form of embodiment of the hanging construction according to this invention, the longitudinal and transverse members of the supporting frame are formed of round tubes and joined together by tubular clamps or the like, and there are suspended from the longitudinally oriented supporting frame tubes, by means of tubular sleeves surrounding them, rods extending down to the container floor and furnished with keyhole-shaped openings, whereby these keyhole-rods are held by means of distance tubes at predetermined intervals from one another corresponding to the hanging width of the particular goods to be transported, and are held transversely by a number of hanging bars. In particular for containers having at least partially inclined lateral walls, provision can be made here for the keyhole rods suspended from the supporting frame to be curved to suit the container lateral walls, and to be held by suitable connecting means, especially tubular sleeves, on floor rods oriented parallel to the longitudinal members of the supporting frame and held at mutual spacings by distance tubes. An additional stiffening of the hanging construction, especially for air freight containers not possessing intrinsic stability, can be ensured by at least two diagonal bracings, attached to the transverse members of the supporting frame, crossing each other in the vicinity of the spatial centre of the container and bearing against the container floor.

According to a further form of embodiment of this invention, intended especially for installation in air freight containers with partially inclined or curved side walls, known as igloos, the supporting frame possesses four longitudinal members, supported at least at their ends, by vertically oriented props of differing lengths to suit the particular container height, from the container floor, and a number of transverse members, disposed in the container cross-section contour and joining together in pairs the longitudinal members, whereby these tranverse members are constituted of three-part hanging bars, oriented horizontally in the middle, upper container region where they connect together the two innermost longitudinal members, and oriented, in the two side wall regions, at opposite inclinations, connecting together one of the innermost longitudinal members with the corresponding outer longitudinal member of the supporting frame. The longitudinal members of the supporting frame may here favourably be formed of tubes of triangular section, possessing keyhole-shaped openings in rows in two faces joining at an acute angle. The vertically oriented props are furnished, over at least a portion of their length, with a succession of keyhole-shaped openings, in which longitudinal beams, preferably constituted of hollow sections of rectangular shape, can be engaged and located by pegs at their ends. At the lower ends, the vertically oriented props possess footplates bearing on the container floor, which either are joined directly to the props or may be connected to them by means of screw spindle drives. In particular for the installation of this hanging construction in air freight containers possessing insufficiently stable walls, the use of floor rods is provided for according to this invention, with which the vertically upstanding props are connected by means of a plug-connection engaging into their hollow section, and which, being optionally composed of assembled part components, bear through a bearing surface upon the container floor and in addition engage into perforated rods disposed in the container floor, by means of arms projecting beyond their bearing surface.

In conjunction with such a form of fixing of the hanging construction to the container floor, the use is also proposed, for the purpose of guaranteeing sufficient intrinsic stiffness independently of the container lateral walls, also for use in flight, of at least two diagonally oriented diagonal bracings crossing in the spatial container centre, which are attached on the one hand by means of suitable support housings in the upper region of the hanging construction to one of the vertically oriented props and on the other hand bear at the opposite end against the container floor, whereby the lower end supporting housing may be connected to one of the floor rods, associated with the props and engaging with the container floor.

The invention is neither limited to the detailed connecting devices illustrated here, such as keyhole bars and push-in pegs, nor to the use of the hanging construction of the invention in containers of the type initially referred to, but it can of course be used with the employment of any other form of embodiment of locating means and may also be incorporated into transportation receptacles of any other type.

Figure 2:
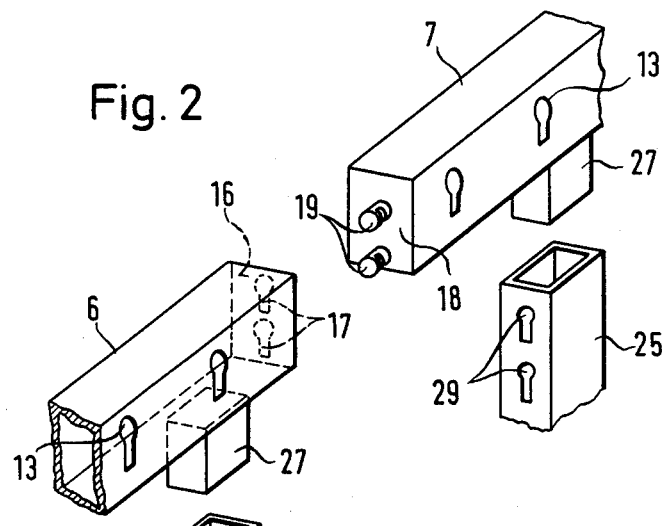
Figure 3:
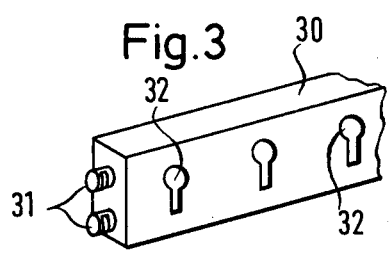
Figure 4:
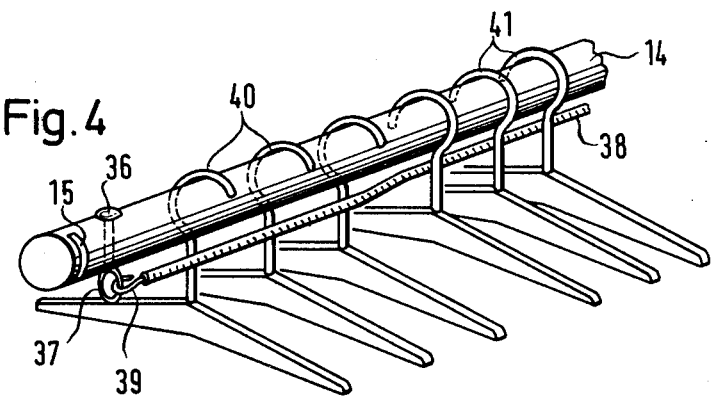
Figure 5:
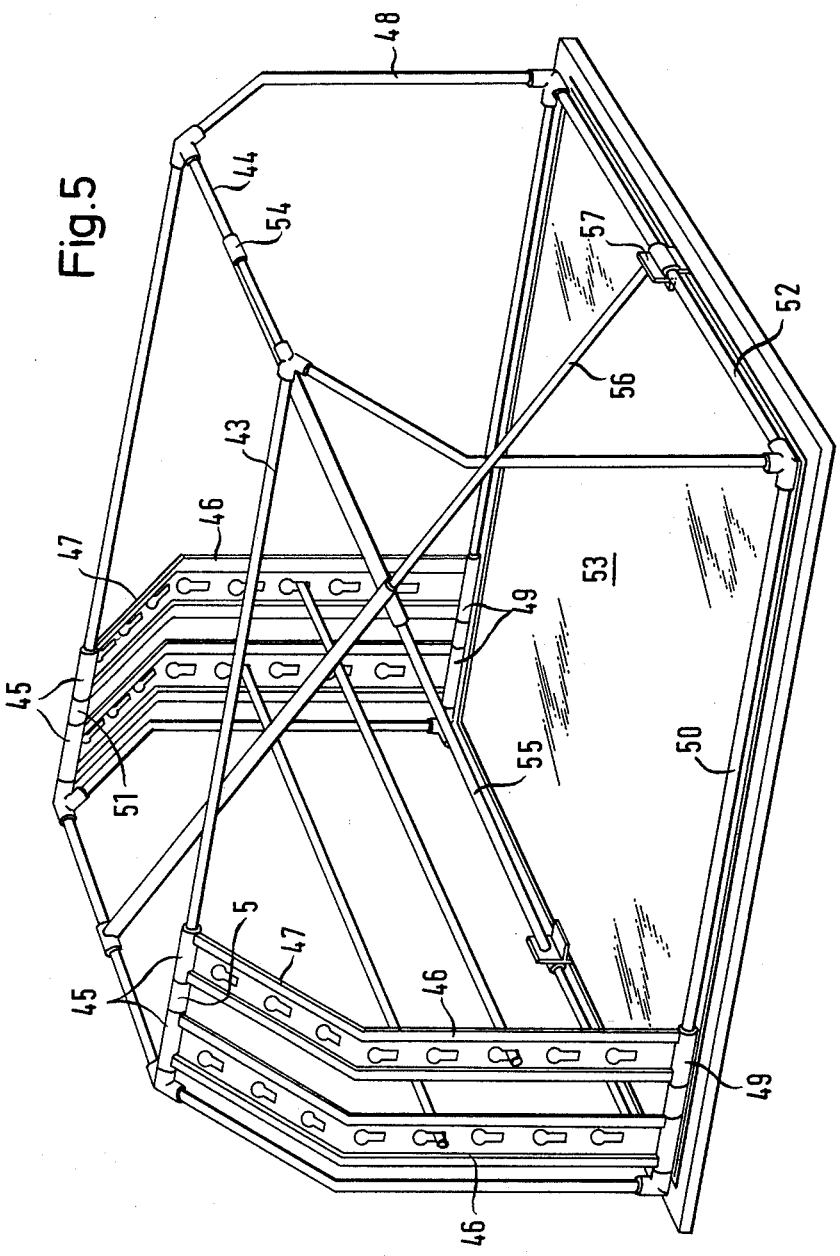
Figure 6:
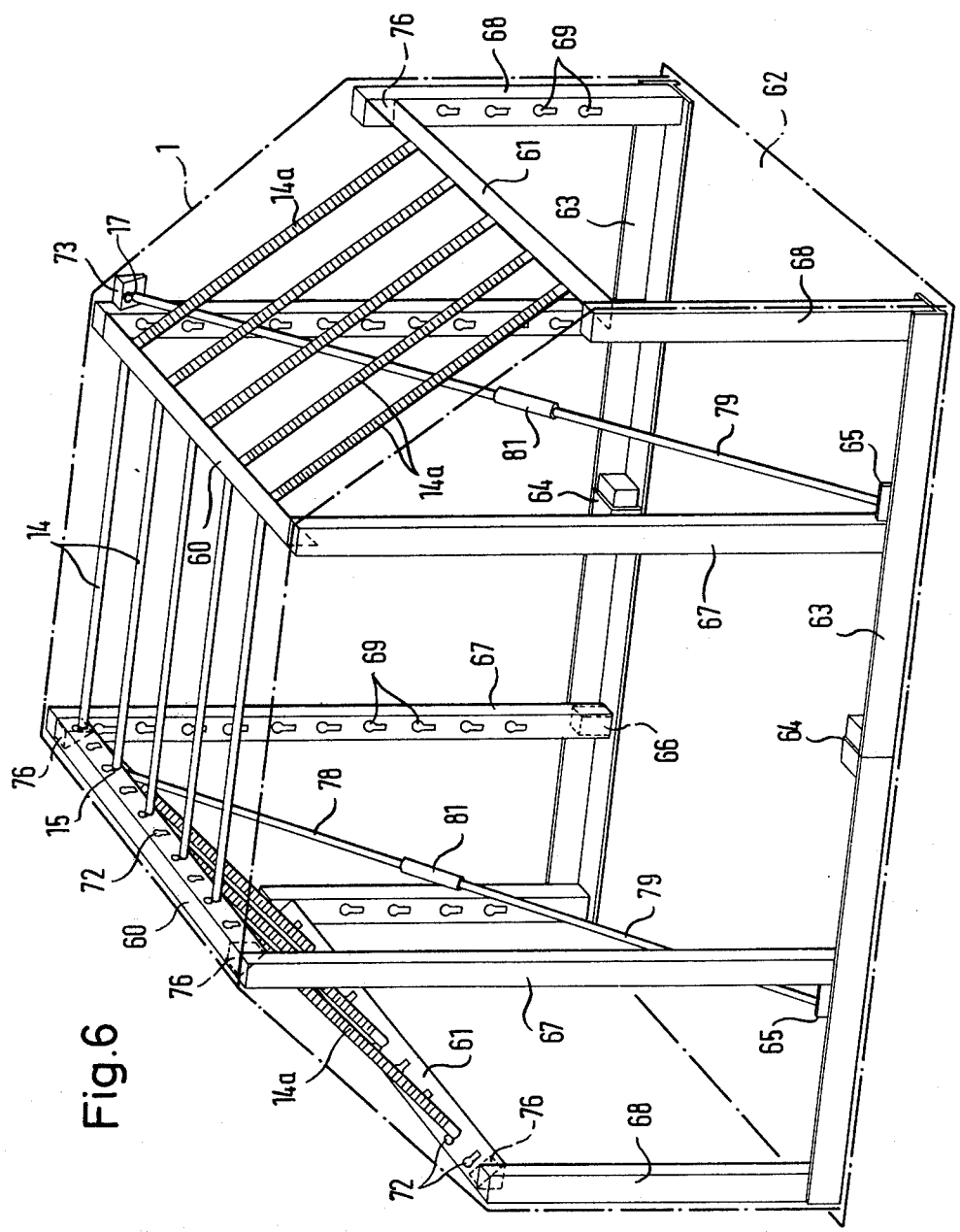
Figure 7:
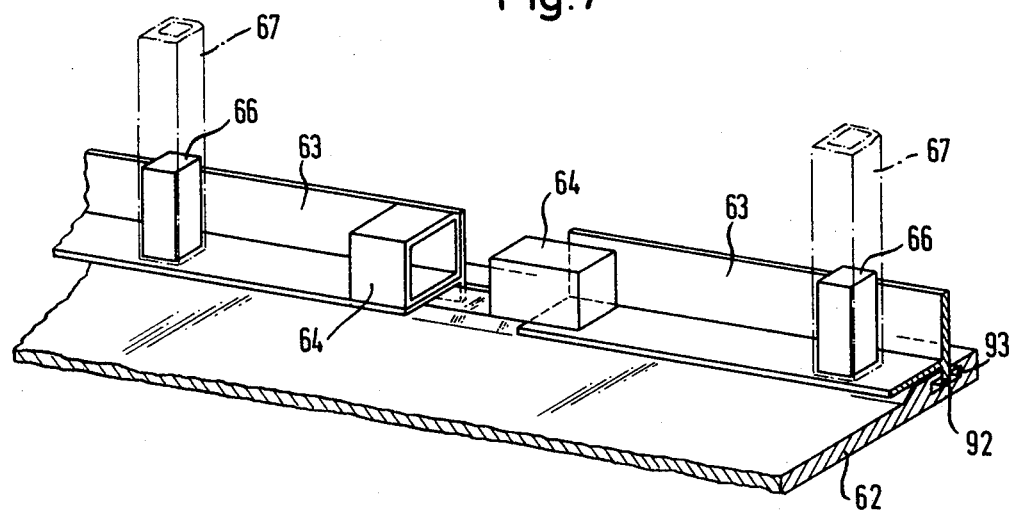
Figure 8:
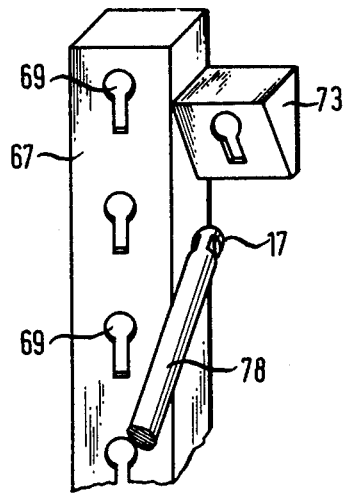

Further details and features of this invention will be seen from the following description of an example, wherein the invention is described with reference to an example of embodiment illustrated in the drawing and from the claims. The drawing shows:

FIG. 1 a partial perspective view of a hanging construction according to this invention, for normal containers;

FIG. 2 a sectional perspective view of the abutment joint between two sections of the longitudinal members of a supporting frame, to enlarged scale;

FIG. 3 a view, also sectional in perspective, of the end of a longitudinal beam to enlarged scale;

FIG. 4 a view, also sectional in perspective, of a holding rod furnished with a coat-hanger retaining device according to this invention, also to enlarged scale;

FIG. 5 a partial perspective view of another form of embodiment of a hanging construction or fitting according to this invention;

FIG. 6 a perspective view of a further form of embodiment of a hanging construction according to this invention;

FIG. 7 a sectional perspective view of a floor bar for a hanging construction according to FIG. 6, to enlarged scale;

FIG. 8 a partial perspective view of the upper end region of a vertically oriented prop of a hanging construction of this invention according to FIG. 6.

The example of embodiment of this invention illustrated in FIGS. 1 to 4 shows, in a standardised container 1 immediately beneath the container roof 2, two longitudinal members 5 extending over the entire container length and braced in the axial direction against the container end walls 3 and 4, which longitudinal members in the example illustrated each consist of two sections 6 and 7 of equal lengths. The longitudinal members 5 are each braced against the corner fittings 11 of the opposite container end walls 3 and 4, by means of a spindle drive consisting of a bearing plate 8, a helical spindle 9 penetrating into the hollow profile of their sections 6 and 7 and also a spindle nut 10 bearing against the sections 6 and 7. The sections 6 and 7 of the longitudinal member 5 consist of four-sided tubes of rectangular cross-section and possess, at their flat side 12 towards the container centre, a continuous sequence of keyhole-shaped openings 13, in which hanging bars 14, replacing transverse members, are located in a tightly fitting manner at both ends by means of radially oriented slit-shaped recesses 15. The two sections 6 and 7 of the longitudinal members 5 are joined together by the engagement of round bars 17 situated at the end face of the section 6 and possessing radially oriented, slit-shaped recesses 16, into keyhole-shaped openings 19 disposed in the end surface 18 of the section 7. The sections 6 and 7 of the longitudinal members 5 are connected to vertically upstanding props 25, braced against the container floor 24 by means of bracing devices consisting of a bearing plate 20, a helical spindle 21 and a spindle nut 23 furnished with a handle 22, by means of downwardly pointing rectangular projections 27 at right angles to the lower face 26 of the members 6 and 7 penetrating into the hollow profile of the props 25. The longitudinal sections 6 and 7 each correspond to a part of the largest possible standardised container length, so that they can serve as extension pieces, to be inserted between the end pieces furnished with an axial bracing device to suit the particular container length and thereby ensure that a hanging construction, constituted of a number of basic components all of the same shape, can be installed in containers of any desired length. In order to ensure further its immovable position within the container 1, the hanging construction is braced tranversely also against the container side walls by means of its supporting frames constituted of longitudinal members 5 and hanging rods 14, whereby the bracing devices each consist of a helical spindle 34, passing through the longitudinal member portions 6 and 7 and furnished both with a bearing plate 33 and also with a handle 35 and bearing by means of a spindle nut inside the longitudinal member portions 6 or 7. The vertically oriented props 25 are formed of a rectangular tube preferably of square cross-section and possess, on their two lateral faces 28 oriented perpendicularly to the container side walls, mutually opposed, keyhole-shaped openings 29, in which longitudinal beam portions 30 extending each between the vertical props can be engaged and located by radially oriented, slit-shaped recesses near their ends, to provide a mounting for rows of hanging rods one above another. The longitudinal beam portions 30 are constituted of portions of a rectangular-section tube cut to a length suited to the interval between props, and are furnished, on their flat side towards the container centre, with a succession of keyhole-shaped openings 32, in which the hanging rods 14 can be located by means of radially oriented, slit-shaped recesses 15 disposed in the region of their ends. As seen especially from FIG. 1, the vertical props 25 are furnished only over their central region with keyhole-shaped openings 29, and are formed with flat surfaces in the vicinity of their upper and lower ends. The hanging rods 14 are preferably constituted of a thick-walled tubular material and are furnished at both ends with slit-shaped, radially oriented recesses 15, by means of which they can be located in the keyhole-shaped openings 13 and 32 respectively of the longitudinal member portions 6 or 7, or of the longitudinal beams 30. The hanging rods 14 are each furnished in the vicinity of their two ends, with a suspension eye 37 secured by means of a rivetted screwed bolt 36, for a coat-hanger retaining device constituted of a stretchable cord 38. The stretchable cord 38, preferably constituted of a rubber clamping band, is in turn equipped at both ends with suspension hooks 39, by means of which it can be suspended in the suspension eyes 37. According to the invention, the hanging rods 14 are hung in alternate sections from the one and the other side with coat-hangers 40, 41, and the stretchable cord 38 is snaked in and out between the coat-hanger groups 40, 41 and stressed in such a manner that it passes in its stressed, retaining position, alternately before and behind the coat-hangers 40, 41 of the various groups. As seen especially from FIG. 4, the suspension eyes for the stretchable cord 38 are thereby so disposed on the hanging rods, that when the hanging rods 14 are located in their hanging position, these eyes point downwards. The hanging construction according to this invention, of a number of relatively short components which can be assembled very simply by means of plug-in connections, and which can be secured in the container by means of bracing devices, makes possible firstly the use of the smallest possible number of largely identical and simply assembled individual components, and also makes possible by means of the longitudinal beams which can be connected at various levels to the vertical props, any desired interval of height between the superimposed rows of hanging rods. With the small spacings between the keyhole-shaped openings, both in the vertically oriented props and also in the longitudinal beam components inserted between them, also in the longitudinal member sections of the supporting frame, it is thus possible for the position of the individual hanging rods to be adjusted in a virtually unlimited manner to the size of articles to be transported, even when it is necessary to transport, in one and the same container, a number of differing types of goods requiring different suspension heights and widths.

FIG. 5 illustrates a hanging construction as used in air freight containers with non-intrinsically stiff end and side walls, the side walls of the air freight container being roof-shaped in their upper region. The hanging construction comprises an upper supporting frame, the longitudinal members 43 and transverse members 44 of which consist of lengths of tube joined together by tubular clamps, and wherein keyhole bars 47, furnished with successive rows of keyhole-openings 46, are connected to the longitudinal members 43 of the supporting frame by means of tubular sleeves 45. The key-hole bars 47 are curved to suit the contour of the container side walls 48 and are supported at their lower ends by tubular sleeves 49 on longitudinally-oriented floor beams 50, also constituted of round tubular sections. The keyhole bars 47 are maintained at their mutual spacings, suited to the particular hanging width of the goods freighted, both on the floor beams 50 and also on the longitudinal member 43 of the supporting frame by tubular distance sleeves 51. The floor beams 50 are held in their relative positions, at least in the region of the container end walls, by transverse beams 52. To ensure sufficient stability of the hanging construction inside the air freight container, the floor beams 50 and/or the transverse beams 52 are furnished with downwardly oriented pegs or the like which engage in perforated bars in the floor 53 of the container. In order further to promote the stability of the hanging contruction, diagonal bracings 55, 56, connected to the transverse members 44 by means of T-shaped tubular clamps 54, are provided, which bear against the container floor by means of supporting housings 57 which are disposed upon the opposite transverse beam 52, these bracings crossing one another in the spatial centre of the container.

A further form of embodiment of this invention is illustrated in FIGS. 6 to 8, and relates to a hanging construction intended for installation into an air freight container and determined by partially roof-shaped inclined side walls, a so-called igloo, which can of course also be used for air freight containers with curved side walls. This hanging construction, intended especially for containers with non-intrinsically stable side and end walls, comprises a supporting frame constituted of longitudinal members 60 and 61, and of hanging rods 14, 14a as transverse members, which in turn is supported from the container floor 62 by means of vertically oriented props 67, 68 of differing heights. At their lower ends, the vertical props 67, 68 are furnished with floor bars 63, whereby these floor bars 63 each consist of two components joined together end to end by a plug-in connection 64, and comprise upwardly oriented projections 66 of square cross-section which penetrate into the hollow profile of the props 67, 68. The floor bars 63 are, in the example illustrated, constituted of angle section bars and possess, on their flange bearing against the container floor 62, downwardly projecting arms 92 which engage in elongated holes 93 in the container floor 62 in such a manner that the floor bars 63 are firmly immovably held to the container floor 62. The vertically oriented props 67 and 68 are formed in pairs of unequal length, the longer props 67 being disposed in the vicinity of the container centre, i.e., in the region of greatest container height, and the shorter props 68 being disposed in the region of the vertical sections of the container side walls, i.e., in the region of smallest container height. The vertically oriented props 67, 68, possess on their surface towards the container centre keyhole-shaped openings 69 disposed one above another. The longitudinal members 60 and 61 of the supporting frame are each disposed in the vicinity of corners of the contour cross-section of the container and possess a triangular cross-section, the orientation of the triangle profile being such that in each case one of the profile surfaces of the longitudinal members 60, 61 is oriented perpendicularly to one of the container side walls or container roof respectively, these surfaces possessing adjacent keyhole-shaped openings 72. At the ends, the longitudinal members 60, 61 of the supporting frame possess welded-in end plates 76 comprising welded-in round bar pegs 17, which possess slit-shaped, radially oriented recesses 16 and can be located in correspondingly disposed keyhole openings of the vertically oriented props 67, 68. At their faces perpendicular to the container side walls or container roof, these longitudinal members 60, 61 of the supporting frame possess a continous succession of keyhole-shaped openings, in which three-part hanging bars 14, 14a can be located in such a manner that they follow the peripheral contour of the container. Here, the hanging bar sections 14a are engaged in the mutually facing surfaces of the longitudinal members 60, 61 in a position parallel to the slope of the upper side wall sections of the container, while the hanging bar sections 14 are engaged in the longitudinal members 60 in a position parallel to the container roof, thus resulting in a portal-shaped arrangement of the hanging rod sections 14 and 14a, these portals being disposed at a mutual spacing from one another suited to the hanging widths of the goods transported. For the purpose of hanging knitted goods, the hanging rod sections 14a associated with the inclined portion of the container side walls may favourably be furnished with a shrunk-on, corrugated tube of plastics. It is also possible for longitudinal beams 30, furnished with keyhole-shaped openings, to be disposed especially between the lower vertical props 68, which longitudinal beams can be engaged by pegs at their ends in keyhole-shaped openings 29 and 69 respectively of the vertical props, so that rows of hanging rods 14 disposed one above another can be inserted in the container. For the same reason, the hanging rod sections 14a disposed at an angle corresponding to the upper side walls of the container can be replaced by keyhole bars, which thus in turn permit the installation of superimposed rows of hanging rods 14 in the upper region of the container also. The constitution according to this invention of the hanging fitting makes possible the installation of hanging rods 14 both in the longitudinal and also in the transverse direction of the container, and at any desired positions one above another. In order to impart to the hanging construction sufficient intrinsic stiffness, independent of the strength of the container end and side walls, for the requirements of air transportation, diagonal bracings 78, 79, crossing one another in the spatial center of the container are provided by this invention, which bracings are secured to the hanging construction in the vicinity of the container roof by means of seatings 73, furnished with keyhole openings and attached to one of the inner, vertically oriented props 67, and bear in the vicinity of the opposite container end wall against the container floor 62. The diagonal bracings 78, 79 can be extended telescopically in their lower third portion and can be locked at any desired extended length by means of a clamp 81. The diagonal bracings 78, 79, formed of round tubular material, possess at their ends welded-in round pegs 80, furnished with slit-shaped, radial recesses, by means of which pegs they can be located in the keyhole-shaped openings of the seatings 65, 73. The base plates of the diagonal bracings 78, 79, forming the support against the container floor 62, may favourably be formed of the floor bars 63, which are in any case present, if the seatings 65 are connected to the floor bars 63 in a suitably rigid manner, for example by welding.

I claim:
1. A detachable frame assembly capable of being removably mounted on the inside of a shipping container of relatively large capacity without requiring structural alteration of said container to adapt said container to have stored therein hanging objects such as garments, said assembly comprising:
   a supporting frame formed of a plurality of longitudinal and transverse straps of an equivalent length which is a fraction of the length of said container, said straps being arranged in groups and connected with each other by lockable plug connections to form support elements for said frame;
   detachable clamping means for bracing said frame against opposite end walls of said container, said detachable clamping means including screw spindle drives for applying oppositely directed forces against said container walls to support said supporting frame within said container;

vertical supports for said straps bearing against said container walls and likewise consisting of a plurality of parts connected together by lockable plug connections and by detachable clamping means including screw spindle drives;

a plurality of suspension rods arranged in a transverse direction of said container and locked on opposite ends thereof with said supporting frame;

said supporting frame being arranged directly beneath the upper wall of said container with said screw spindle drives each containing a supporting plate bearing on a wall of said container, a screw spindle extending to within the support elements of said supporting frame, and a spindle nut including handles and bearing upon an end space of a support element of said supporting frame.

2. An assembly according to claim 1 wherein the parts forming said longitudinal strap are braced against said container side walls by additional transverse clamping means formed with screw spindles traversing the side member sections of said frame and provided with a supporting plate and with a handle.

3. An assembly according to claim 1 wherein said longitudinal straps and said vertical supports are formed of tubular sections having a square cross-sectional configuration and provided on at least one side thereof with continuously arranged keyhole-shaped recesses, and wherein side member sections provided for insertion between said vertical supports are formed of tubular sections having a rectangular cross-sectional configuration, the keyhole recesses of said supports being arranged at least over a part of their length on lateral faces extending perpendicularly to the side wall of said container and the keyhole recesses of said longitudinal straps and of said side member sections being arranged in surfaces thereof extending parallel to the container side wall, with transverse straps of said supporting frame being formed by a plurality of suspension rods which may be locked at both ends in the keyhole recesses of said longitudinal straps.

4. An assembly according to claim 3 wherein said longitudinal straps of said supporting frame each consists of parts having a length corresponding to a fraction of the maximum length of said container, said parts engaging at the front end over rectangularly bent-off pins, the hollow profile of said vertical supports and connected with each other over keyhole recesses and pins engaging the latter, the inside member sections inserted between said vertical supports of the supporting frame being locked over pins arranged at the front end thereof in the keyhole recesses of the lateral surfaces of said supports.

5. An assembly according to claim 1 wherein each of said suspension rods includes a hanger safety device comprising a pair of engaging eyes arranged in the end regions of said suspension rod, an elastic rope formed particularly of a rubber clamping band provided at both ends with engaging hooks, said engaging eyes being so arranged on said suspension rod to be downwardly directed when said suspension rod is locked in its hanging position.

6. An assembly according to claim 5 wherein said suspension rods are hung in sections with hangers alternately from one side and the other side, and wherein said elastic rope is arranged to extend between said hanger groups in a serpentine formation braced in such a way as to pass in its secured clamped position alternately in front of and behind the hangers of various groups.

7. An assembly according to claim 1 wherein said longitudinal straps of said supporting frame are formed by round tubular sections and wherein rails provided with tube sockets embracing said longitudinal straps at the upper end extend to said container bottom and are provided with keyhole recesses and are threaded on the longitudinal straps of said supporting frame and held by means of distance tube sockets in distances corresponding to the hanging width of the goods to be shipped within said container, and in a transverse direction by a plurality of suspension rods.

8. An assembly according to claim 7 wherein said longitudinal straps are arranged to bear against the container bottom through vertical support members of differing lengths corresponding to the respective height of said container, with a plurality of transverse straps arranged in the circumferential contour of said container being provided connecting the longitudinal straps in pairs, said transverse straps being formed by three-piece suspension rods which are arranged horizontally in the central range of said container connecting two inner longitudinal straps of said supporting frame held at mutual distances from each other by means of traverses and locked against said container bottom.

9. An assembly according to claim 1 wherein said container comprises non-rigid side walls and is of the type particularly suited for use with air freight, said container defining therein storage areas of different heights, and wherein said supporting frame comprises longitudinal straps bearing at their ends against the bottom of said container through vertical support members of different lengths, the length of said vertical support members corresponding to the respective height of the storage section of said container in which said vertical support is located, with a plurality of transverse straps being arranged in the circumferential contour of said container and connecting said longitudinal straps in pairs, the transverse straps being formed by three-piece suspension rods which, when arranged horizontally in the central range of said container, connect a pair of inner longitudinal straps of said supporting frame and which, when inclined in the lateral regions in opposite directions of said container, connect an inner longitudinal strap of said supporting frame with a corresponding outer longitudinal strap.

10. An assembly according to claim 9 wherein said vertical support members are received in divided bottom rails which are plugged together, with at least one of said bottom rails having a downwardly pointing arm in engagement with an oblong recess formed in said container bottom.

11. An assembly according to claim 9 wherein said longitudinal straps are formed by hollow members having a triangular cross section and provided with keyhole recesses on at least two sides thereof extending toward each other in an acute angle.

12. An assembly according to claim 9 including a pair of diagonal struts intersecting in the spatial center of said container and supported at their bottom ends in bottom rails extending within said container with the upper ends of said struts acting through blocks welded upon said vertical supports, said struts being locked with respective blocks and including telescoping means arranged to enable clamping of said struts in any desired position.

* * * * *